United States Patent
Iguchi et al.

(10) Patent No.: US 12,287,428 B2
(45) Date of Patent: Apr. 29, 2025

(54) LIGHT-EMITTING DEVICE, OPTICAL DEVICE, MEASUREMENT DEVICE, AND INFORMATION PROCESSING APPARATUS

(71) Applicant: FUJIFILM Business Innovation Corp., Tokyo (JP)

(72) Inventors: Daisuke Iguchi, Kanagawa (JP); Tomoaki Sakita, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 1053 days.

(21) Appl. No.: 17/106,155

(22) Filed: Nov. 29, 2020

(65) Prior Publication Data
US 2021/0302540 A1   Sep. 30, 2021

(30) Foreign Application Priority Data
Mar. 24, 2020   (JP) .................. 2020-053257

(51) Int. Cl.
G01S 7/481   (2006.01)
G01S 7/484   (2006.01)
G01S 17/08   (2006.01)
H01S 5/0683   (2006.01)
H01S 5/42   (2006.01)

(52) U.S. Cl.
CPC ............. G01S 7/4811 (2013.01); G01S 7/484 (2013.01); G01S 17/08 (2013.01); H01S 5/0683 (2013.01); H01S 5/423 (2013.01)

(58) Field of Classification Search
CPC ...................................... G01S 7/484
See application file for complete search history.

(56) References Cited

U.S. PATENT DOCUMENTS

| | | | |
|---|---|---|---|
| 8,675,706 B2 | 3/2014 | Seurin et al. | |
| 8,783,893 B1 | 7/2014 | Seurin et al. | |
| 9,368,936 B1 | 6/2016 | Lenius et al. | |
| 10,983,197 B1 * | 4/2021 | Zhu | G01S 17/10 |
| 11,923,658 B1 * | 3/2024 | Lenius | G01S 7/484 |
| 2002/0051128 A1 * | 5/2002 | Aoyama | G01S 7/4811 |
| | | | 356/4.03 |
| 2019/0036308 A1 | 1/2019 | Carson et al. | |
| 2019/0213309 A1 * | 7/2019 | Morestin | G01S 17/04 |

FOREIGN PATENT DOCUMENTS

| | | |
|---|---|---|
| CN | 103178442 | 6/2013 |
| CN | 110456374 | 11/2019 |
| JP | 2008-252129 | 10/2008 |

(Continued)

OTHER PUBLICATIONS

Nicolas Bonod and Jérôme Neauport, "Diffraction gratings: from principles to applications in high-intensity lasers," Adv. Opt. Photon 8, 156-199 (2016) (Year: 2016).*

(Continued)

*Primary Examiner* — Yuqing Xiao
*Assistant Examiner* — Clara G Chilton
(74) *Attorney, Agent, or Firm* — JCIPRNET

(57) ABSTRACT

A light-emitting device includes plural driving units; plural laser element arrays connected to the respective plural driving units; and a connection wire that interconnects terminals of the plural laser element arrays, the terminals being connected to the plural driving units.

14 Claims, 10 Drawing Sheets

(56) References Cited

FOREIGN PATENT DOCUMENTS

JP          2009094308          4/2009
JP          2015153862  A  *   8/2015

OTHER PUBLICATIONS

"Office Action of Japan Counterpart Application", issued on Jan. 9, 2024, with English translation thereof, p. 1-p. 3.
"Office Action of China Counterpart Application", issued on Aug. 28, 2024, with English translation thereof, p. 1-p. 18.
"Office Action of China Counterpart Application No. 202011207870.8", with English translation thereof, issued on Mar. 8, 2025, p. 1-p. 9.

* cited by examiner

LIGHT-EMITTING DEVICE, OPTICAL DEVICE, MEASUREMENT DEVICE, AND INFORMATION PROCESSING APPARATUS

CROSS-REFERENCE TO RELATED APPLICATIONS

This application is based on and claims priority under 35 USC 119 from Japanese Patent Application No. 2020-053257 filed Mar. 24, 2020.

BACKGROUND

(i) Technical Field

The present disclosure relates to a light-emitting device, an optical device, a measurement device, and an information processing apparatus.

(ii) Related Art

Japanese Unexamined Patent Application Publication No. 2008-252129 describes a light-emitting device including a ceramic substrate having light transmission properties, a light-emitting element mounted on a surface of the ceramic substrate, a wiring pattern for supplying power to the light-emitting element, and a metallization layer made of a metal having light reflectivity, the metallization layer being provided in the ceramic substrate so as to reflect light emitted from the light-emitting element.

SUMMARY

Measurement of a three-dimensional shape of an object to be measured according to a Time of Flight (ToF) method using a flight time of light requires a high light emission intensity of a light source and a short rise time of light emission. One method for increasing a light emission intensity is to employ a light source constituted by plural laser element arrays, which are driven by respective plural driving units. With this configuration however, a rise time of light emission becomes long due to delay of a rise time of each laser element array.

Aspects of non-limiting embodiments of the present disclosure relate to a light-emitting device etc. that is shorter in rise time of light emission than in a case where plural laser element arrays are driven by respective plural driving units.

Aspects of certain non-limiting embodiments of the present disclosure overcome the above disadvantages and/or other disadvantages not described above. However, aspects of the non-limiting embodiments are not required to overcome the disadvantages described above, and aspects of the non-limiting embodiments of the present disclosure may not overcome any of the disadvantages described above.

According to an aspect of the present disclosure, there is provided a light-emitting device including plural driving units; plural laser element arrays connected to the respective plural driving units; and a connection wire that interconnects terminals of the plural laser element arrays, the terminals being connected to the plural driving units.

BRIEF DESCRIPTION OF THE DRAWINGS

Exemplary embodiments of the present disclosure will be described in detail based on the following figures, wherein:

FIG. 7A is a plan view, and FIG. 7B is a cross-sectional view taken along line VIIB-VIIB of FIG. 7A;

DETAILED DESCRIPTION

Figure 1:
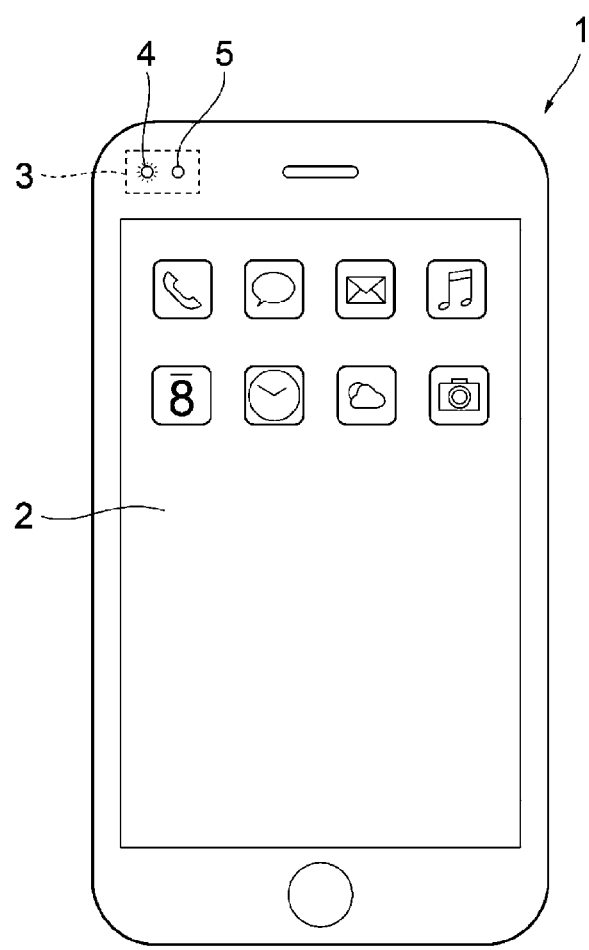
FIG. 1 illustrates an example of an information processing apparatus.

Exemplary embodiments of the present disclosure are described in detail below with reference to the attached drawings.

Some measurement devices for measuring a three-dimensional shape of an object to be measured measure a three-dimensional shape according to a Time of Flight (ToF) method using a flight time of light. According to the ToF method, a period from a timing of emission of light from a light-emitting device of the measurement device to a timing of reception, by a three-dimensional sensor (hereinafter referred to as a 3D sensor) of the measurement device, of light reflected by an object to be measured is measured, and a three-dimensional shape of the object to be measured is specified based on a measured three-dimensional shape. An object whose three-dimensional shape is to be measured is referred to as an object to be measured. A three-dimensional shape may be also referred to as a three-dimensional image. Measurement of a three-dimensional shape may be referred to as three-dimensional measurement, 3D measurement, or 3D sensing.

Such a measurement device is mounted, for example, in a mobile information processing apparatus and is used for face authentication of a user who attempts to access the mobile information processing apparatus. Conventionally, apparatuses such as a mobile information processing apparatus authenticate a user, for example, by using a password, a fingerprint, or an iris. Recently, there are demands for an authentication method of higher security. In response to such demands, recent mobile information processing apparatuses include a measurement device for measuring a three-dimensional shape. That is, a recent mobile information processing apparatus acquires a three-dimensional shape of a face of a user who accessed the mobile information processing apparatus, determines whether or not the user has access permission, and permits the user to use the mobile information processing apparatus only in a case where the user is authenticated as a user having access permission.

In the following description, it is, for example, assumed that the information processing apparatus is a mobile information processing terminal and a user is authenticated through recognition of a shape of a face captured as a three-dimensional image. Note that the information processing apparatus may be an information processing apparatus of other kinds such as a personal computer (PC).

According to the ToF method, a period from a timing of emission of light from a light-emitting device of a measurement device to a timing of reception, by a 3D sensor of the measurement device, of light reflected by an object to be measured is measured, and therefore a short rise time of light emission is required. A shorter rise time of light emission means higher accuracy of measurement. The "rise time of light emission" as used herein refers to a time it takes for a light amount to reach 90% of a maximum light amount from the start of light emission.

Furthermore, configurations, functions, methods, and the like described in the exemplary embodiments below can be applied to recognition of an object to be measured other than a face based on a measured three-dimensional image. Furthermore, such a measurement device is also applied to a case where a three-dimensional shape of an object to be measured is continuously measured (e.g., augmented reality (AR)). There is no restriction on a distance to the object to be measured. Although it is only necessary to radiate light to a face located close to a light source in the case of face authentication, it is required to radiate light to an object to be measured located farther than a face in the case of augmented reality. In view of this, a light source is required to be large in light amount.

Furthermore, configurations, functions, methods, and the like described in the exemplary embodiments below can be applied to measurement of a three-dimensional shape of an object to be measured other than face authentication and augmented reality.

First Exemplary Embodiment

Information Processing Apparatus 1

FIG. 1 illustrates an example of an information processing apparatus 1. As described above, the information processing apparatus 1 is, for example, a mobile information processing terminal.

The information processing apparatus 1 includes a user interface unit (hereinafter referred to as a UI unit) 2 and an optical device 3 that measures a three-dimensional shape. The UI unit 2 is, for example, a unit in which a display device for displaying information for a user and an input device that receives an instruction concerning information processing from a user are integrated with each other. The display device is, for example, a liquid crystal display or an organic EL display, and the input device is, for example, a touch panel.

The optical device 3 includes a light-emitting device 4 and a three-dimensional sensor (hereinafter referred to as a 3D sensor) 5. The light-emitting device 4 radiates light toward an object to be measured (a face in this example). The 3D sensor 5 acquires light that is emitted by the light-emitting device 4 and is then reflected back by a face. In this example, a three-dimensional shape is measured according to the Time of Flight method using a flight time of light. Then, a three-dimensional shape of the face is specified on the basis of the three-dimensional shape thus measured. As described above, the 3D sensor 5 may measure a three-dimensional shape of an object other than a face. The 3D sensor 5 is an example of a light receiving unit.

The information processing apparatus 1 is a computer including a CPU, a ROM, and a RAM. Examples of the ROM include a non-volatile rewritable memory such as a flash memory. Programs and constant numbers accumulated in the ROM are loaded into the RAM, and the CPU executes the programs. The information processing apparatus 1 thus operates and executes various kinds of information processing.

Figure 2:
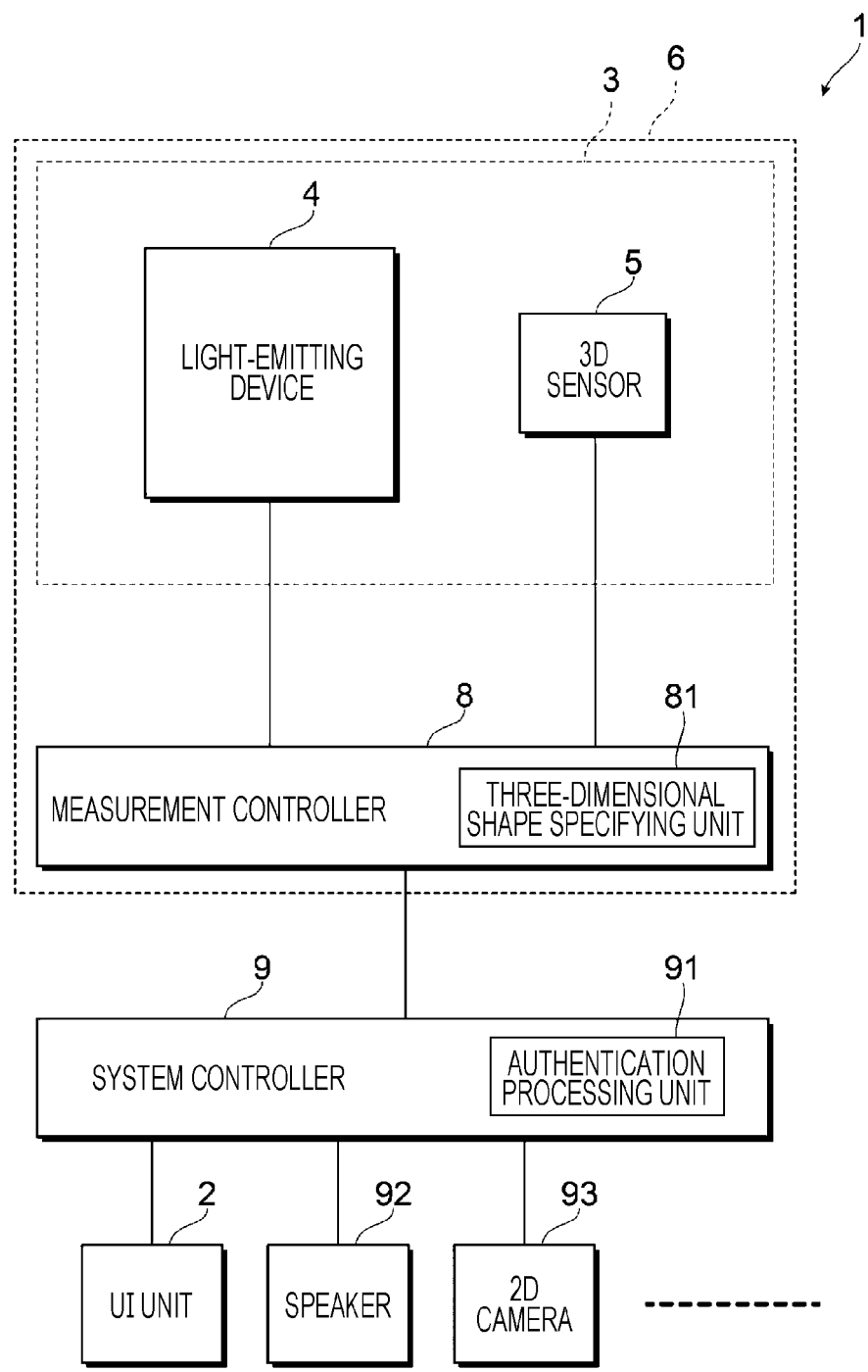
FIG. 2 is a block diagram for explaining a configuration of the information processing apparatus.

FIG. 2 is a block diagram for explaining a configuration of the information processing apparatus 1.

The information processing apparatus 1 includes the optical device 3, a measurement controller 8, and a system controller 9. As described above, the optical device 3 includes the light-emitting device 4 and the 3D sensor 5. The measurement controller 8 controls the optical device 3. The measurement controller 8 includes a three-dimensional shape specifying unit 81. The system controller 9 controls the whole information processing apparatus 1 as a system. The system controller 9 includes an authentication processing unit 91. The system controller 9 is connected to members such as the UI unit 2, a speaker 92, and a two-dimensional camera (referred to as a 2D camera in FIG. 2) 93.

The three-dimensional shape specifying unit 81 of the measurement controller 8 specifies a three-dimensional shape of an object to be measured from a three-dimensional shape measured based on light reflected by the object to be measured. The authentication processing unit 91 of the system controller 9 determines whether or not a user has access permission on the basis of the three-dimensional shape specified by the three-dimensional shape specifying unit 81 and authenticates the user in a case where the user has access permission.

In FIG. 2, the measurement device 6 includes the optical device 3 and the measurement controller 8. Although the optical device 3 and the measurement controller 8 are separate from each other in FIG. 2, the optical device 3 and the measurement controller 8 may be integral with each other.

These members are described below in order.

Light-Emitting Device 4

Figure 3:
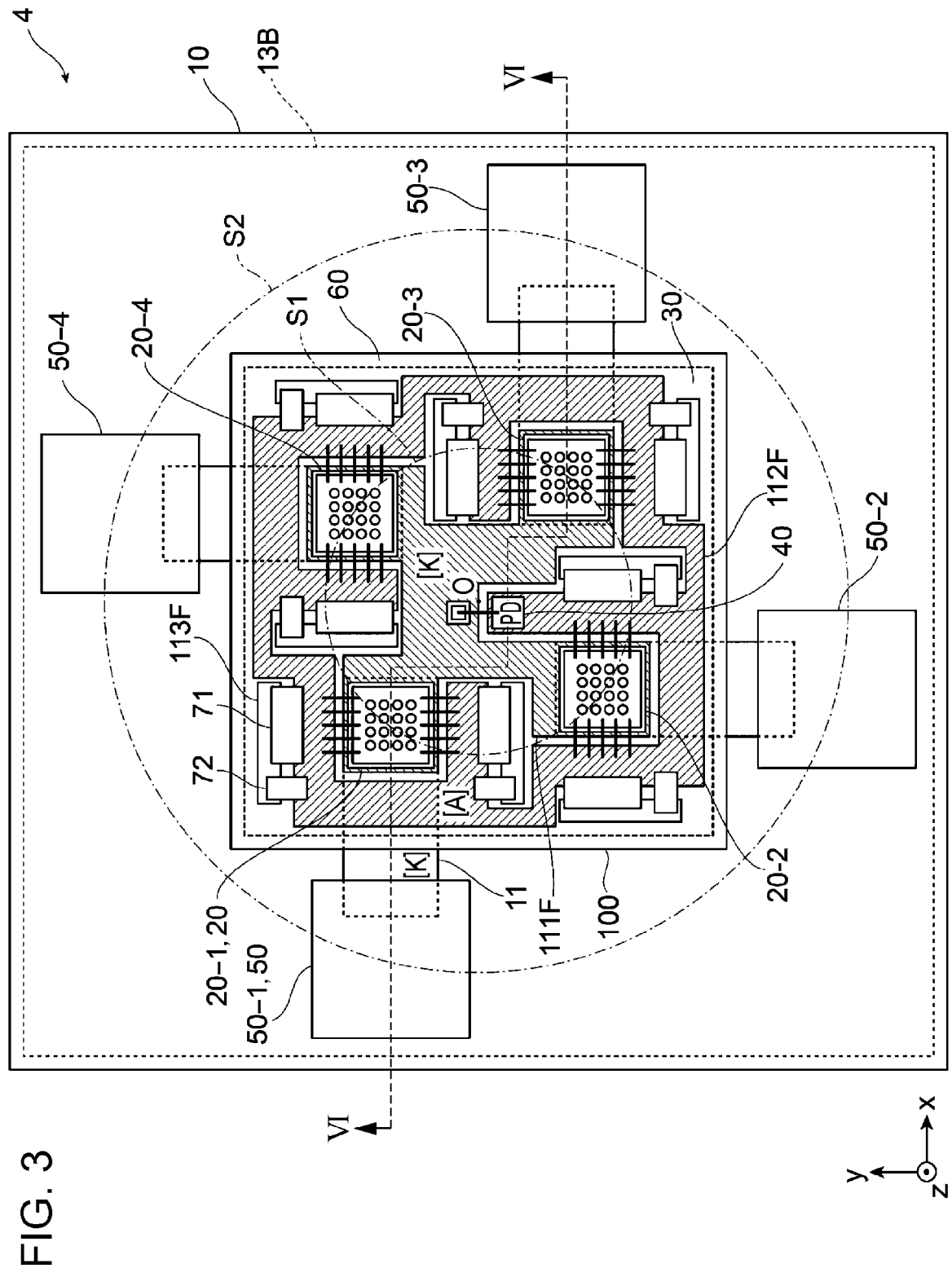
FIG. 3 illustrates an example of a plan view of a light-emitting device.

FIG. 3 illustrates an example of a plan view of the light-emitting device 4. It is assumed that the rightward direction, the upward direction, and the frontward direction of the paper on which FIG. 3 is drawn are an x direction, a y direction, and a z direction, respectively.

The light-emitting device 4 includes a circuit board 10, four light sources 20, a light amount monitoring light-receiving element (in FIG. 3 and hereinafter referred to as PD) 40, four driving units 50 that drive the four light sources 20, respectively, capacitors 71 and 72 that supply an electric current for light emission and are provided in each of the light sources 20, and a heat releasing base member 100. In a case where the four light sources 20 are distinguished from one another, the four light sources 20 are referred to as light sources 20-1, 20-2, 20-3, and 20-4, and in a case where the four light sources 20 are not distinguished from one another, the four light sources 20 are referred to as light sources 20. Similarly, in a case where the driving units 50 are distinguished from one another, the driving units 50 are referred to as driving units 50-1, 50-2, 50-3, and 50-4, and in a case where the driving units 50 are not distinguished from one another, the driving units 50 are referred to as driving units 50. Although the light-emitting device 4 includes plural capacitors equivalent to the capacitors 71 and 72, reference signs thereof are omitted.

Furthermore, the light-emitting device 4 includes a light diffusion member 30 and a holding unit 60. The heat releasing base member 100 and the driving units 50 are provided on a front surface of the circuit board 10. The four light sources 20, the PD 40, and the capacitors 71 and 72 are provided on a front surface of the heat releasing base member 100. The light diffusion member 30 is held by the holding unit 60 on the front surface side of the heat releasing base member 100. The light diffusion member 30 is held apart by a predetermined distance from the light sources 20, the PD 40, and the capacitors 71 and 72 (see FIG. 6, which will be described later). Note that the front surface is a front side of the paper on which FIG. 3 is drawn. More specifically, a side of the circuit board 10 on which the driving units 50 and the heat releasing base member 100 are provided is referred to as a front surface, a front side, or a front surface side. A side of the heat releasing base member 100 on which the light sources 20, the PD 40, and the capacitors 71 and 72 are provided is referred to as a front surface, a front side, or a front surface side. A center of the four light sources 20 of the light-emitting device 4, that is, a center in the x direction and the y direction is referred to as a center 0. Hereinafter, seeing through members from the front surface side is referred to as top view.

The four light sources 20 (the light sources 20-1, 20-2, 20-3, and 20-4) are disposed on a circle S1 whose center is the center 0. Furthermore, the driving units 50 (the driving units 50-1, 50-2, 50-3, and 50-4) are disposed on a circle S2 whose center is the center 0. That is, the light sources 20 and the driving units 50 are disposed on concentric circles having the same center 0. This prevents distances between the light sources 20 and the driving units 50 (e.g., a distance between the light source 20-1 and the driving unit 50-1) from varying. That is, the center 0 of the light sources 20 may be deviated from the center of the heat releasing base member 100, and the center 0 of the light sources 20 may be deviated from the center of the circuit board 10.

Note that the center 0 may be the center of the heat releasing base member 100. That is, the light sources 20 may be arranged on a circle whose center is the center of the heat releasing base member 100, and the driving units 50 may be arranged on another circle whose center is the center of the heat releasing base member 100. The center 0 may be the center of the circuit board 10. That is, the light sources 20 may be arranged on a circle whose center is the center of the circuit board 10, and the driving units 50 may be arranged on another circle whose center is the center of the circuit board 10.

Each of the light sources 20 is a light-emitting element array including plural light-emitting elements that are two-dimensionally arranged. The light-emitting elements are, for example, vertical cavity surface emitting lasers (VCSELs). In the following description, it is assumed that the light-emitting elements are vertical cavity surface emitting lasers (VCSELs). The vertical cavity surface emitting lasers (VCSELs) are hereinafter referred to as VCSELs. Since the light sources 20 are provided on the front surface of the heat releasing base member 100, the light sources 20 emit light in a direction perpendicular to the front surface of the heat releasing base member 100 in a direction departing from the heat releasing base member 100. That is, the light-emitting element array is a surface light emission laser element array. The plural light-emitting elements of each of the light sources 20 are two-dimensionally arranged, and surfaces of the light sources 20 from which light is emitted are sometimes referred to as emission surfaces. The light sources 20 are an example of laser element arrays.

The light diffusion member 30 is provided on light emission paths of the light sources 20. The light diffusion member 30 diffuses incident light emitted from the light sources 20 and outputs the diffused light. Light emitted from the light sources 20 reaches an object to be measured after being diffused by the light diffusion member 30. That is, the light emitted by the light sources 20 is radiated in a wider range by being diffused by the light diffusion member 30 than in a case where the light diffusion member 30 is not provided.

The PD 40 is a photodiode made of silicon and outputs an electric signal according to an amount of received light (hereinafter referred to as a received light amount). The PD 40 is disposed so as to receive light emitted from the light sources 20 and then reflected by a rear surface (a surface on a −z direction side in FIG. 6, which will be described later) of the light diffusion member 30. The light sources 20 are controlled to emit light while keeping a predetermined light amount on the basis of the amount of light received by the PD 40. That is, the measurement controller 8 monitors the amount of light received by the PD 40 and controls amounts of light emitted from the light sources 20 by controlling the driving units 50.

In a case where three-dimensional measurement is performed by using the ToF method, the light sources 20 are required to emit, for example, pulsed light (hereinafter referred to as an emitted light pulse) of 100 MHz or more whose rise time is 1 ns or less by the driving units 50. For example, in an example of face authentication, a distance over which light is radiated is approximately 10 cm to approximately 1 m. A range irradiated with light is approximately 1 m square. The distance over which light is radiated is referred to as a measurement distance, and the range irradiated with light is referred to as an irradiation range or a measurement range. A plane virtually provided in the irradiation range or the measurement range is referred to as an irradiation plane. In cases other than face authentication, the measurement distance to the object to be measured and the irradiation range of the object to be measured may be different from those described above.

The 3D sensor 5 illustrated in FIG. 2 is a member that includes plural light receiving cells and outputs a signal corresponding to a period from emission of light from the light sources 20 of the light-emitting device 4 to reception of the light by the 3D sensor 5. For example, each of the light receiving cells of the 3D sensor 5 is configured to receive pulsed light (hereinafter referred to as a received pulse) that is an emitted pulse from the light sources 20 reflected by an object to be measured and accumulate, for each light receiving cell, an electric charge corresponding to a period to the reception of the light. The 3D sensor 5 is a device having a CMOS structure in which each light receiving cell includes two gates and electric charge accumulating units corresponding to the two gates. By alternately applying a pulse to the two gates, a generated photoelectron is transferred to any of the two electric charge accumulating units at a high speed. In the two electric charge accumulating units, an electric charge according to a phase difference between an emitted light pulse and a received pulse is accumulated. The 3D sensor 5 outputs, as a signal for each light receiving cell, a digital value according to a phase difference between an emitted light pulse and a received pulse through an AD converter. That is, the 3D sensor 5 outputs a signal corresponding to a period from emission of light from the light sources 20 to reception of the light by the 3D sensor 5. Accordingly, a signal corresponding to a three-dimensional shape of the object to be measured is acquired from the 3D sensor 5. The AD converter may be provided in the 3D sensor 5 or may be provided outside the 3D sensor 5.

The three-dimensional shape specifying unit 81 of the measurement controller 8 acquires a digital value obtained for each light receiving cell from the 3D sensor 5 and calculates a distance to the object to be measured for each light receiving cell in a case where the 3D sensor 5 is, for example, a device having a CMOS structure as described above. Then, the three-dimensional shape specifying unit 81 measures and specifies a three-dimensional shape of the object to be measured based on the calculated distance and outputs the specified three-dimensional shape. The three-dimensional shape specifying unit 81 functions as a distance specifying unit that specifies a distance to the object to be measured.

As described above, the measurement controller 8 is a computer, and the three-dimensional shape specifying unit 81 is realized by a program. However, these members may be realized by an integrated circuit such as an ASIC or an FPGA. Alternatively, these members may be realized by software such as a program and an integrated circuit such as an ASIC.

As described above, the information processing apparatus 1 diffuses light emitted from the light sources 20, irradiates an object to be measured with the diffused light, and causes the 3D sensor 5 to receive the light reflected by the object to be measured. In this way, the information processing apparatus 1 measures a three-dimensional shape. Accordingly, the light-emitting device 4 is required to be large in light amount not only in the case of face authentication but also in measurement of a three-dimensional shape in augmented reality. In view of this, in the first exemplary embodiment, the plural light sources 20 are used. Such a light-emitting device 4 is required to efficiently release heat from the light sources 20.

On the heat releasing base member 100, a cathode wire 111F (indicated by [K]) connected to cathodes (cathode electrodes 214 illustrated in FIG. 5, which will be described later) of the light sources 20, an anode wire 112F (indicated by [A]) connected to anodes (anode electrodes 218 illustrated in FIG. 5) of the light sources 20, and reference potential wires 113F (indicated by [G]) to which a reference potential is supplied are provided. The reference potential is, for example, ground potential (GND). As illustrated in FIG. 3, plural reference potential wires 113F are provided. The cathode wire 111F, the anode wire 112F, and the reference potential wires 113F may be sometimes collectively referred to as wires. The same applies to other cases. Note that a wire is a conductive pattern connected to an electric circuit, and a shape thereof is not limited.

Figure 4:
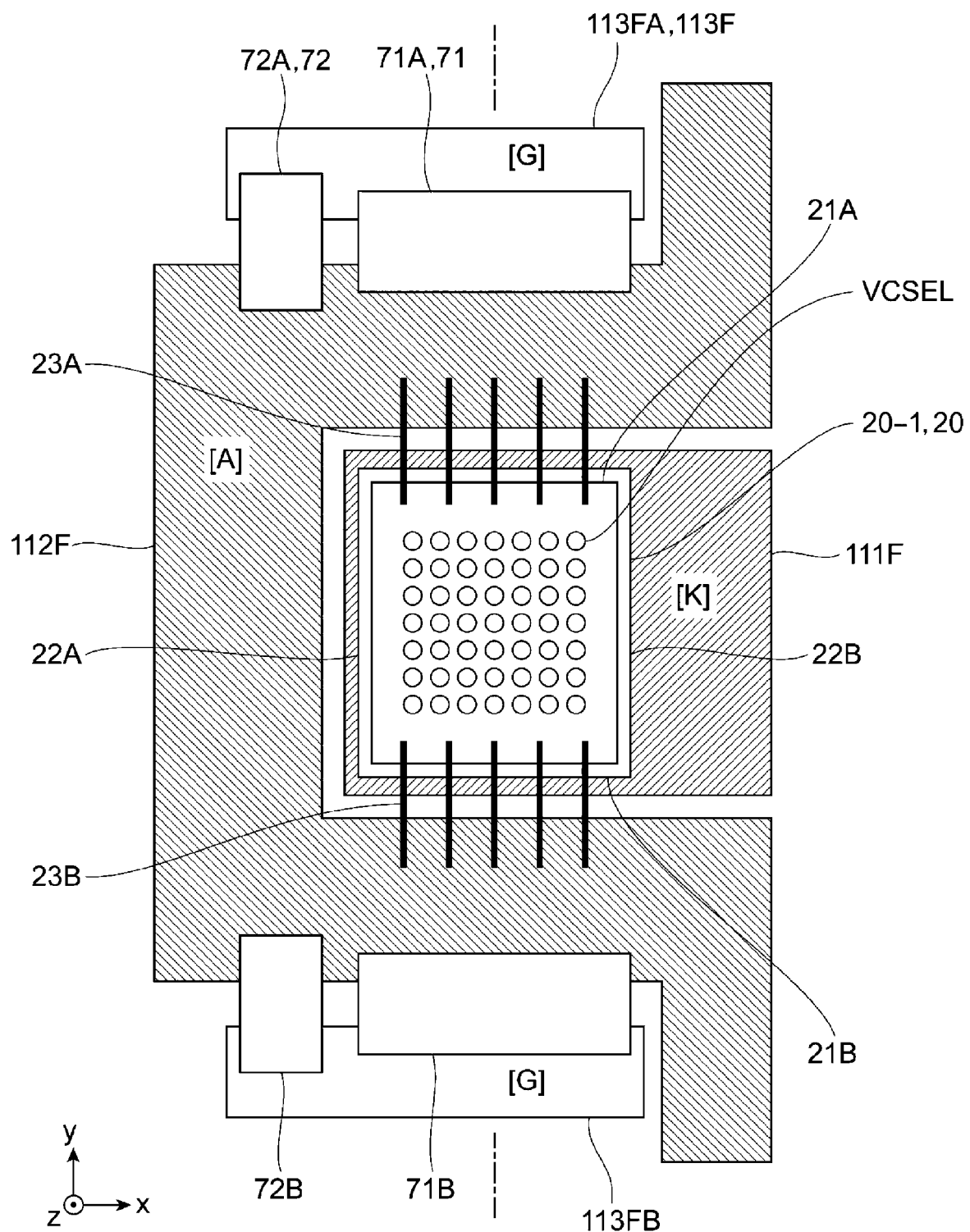
FIG. 4 is an enlarged view of a part of the light-emitting device.

FIG. 4 is an enlarged view of a part of the light-emitting device 4. FIG. 4 is an enlarged view of a part corresponding to the light source 20-1 in the light-emitting device 4. FIG. 4 illustrates the light source 20-1 and the capacitors 71 and 72 that supply an electric current for light emission to the light source 20-1. In FIG. 4, the capacitors 71 are referred to as capacitors 71A and 71B, and the capacitors 72 are referred to as capacitors 72A and 72B. The reference potential wires 113F are referred to as reference potential wires 113FA and 113FB.

As described above, the light source 20-1 and the capacitors 71A, 71B, 72A, and 72B are provided on the front surface of the heat releasing base member 100. In FIG. 4, a connection relationship among the light source 20-1, the wires provided on the front surface of the heat releasing base member 100, and the capacitors 71A, 71B, 72A, and 72B is described.

The light source 20-1 has a rectangular planar shape and has a side surface 21A on a +y direction side, a side surface 21B on a −y direction side, and a side surface 22A on a −x direction side, and a side surface 22B on a +x direction side. As described above, each of the light sources 20 includes plural VCSELs that are arranged in a two-dimensional array.

Each of the VCSELs is a light-emitting element configured such that an active region that serves as a light-emitting region is provided between a lower multilayer film reflector and an upper multilayer film reflector stacked on a semiconductor substrate 200 (see FIG. 5, which will be described later) and emits laser light in a direction perpendicular to a surface of the semiconductor substrate 200. It is therefore easier to arrange the VCSELS in a two-dimensional array than in a case where end-surface emission type lasers are used. The anode electrode 218 (see FIG. 5) common to the plural VCSELs is provided on a front surface of each light source 20. The cathode electrode 214 is provided on a rear surface of each light source 20 (see FIG. 5). That is, the plural VCSELs are connected in parallel. In a case where the plural VCSELs that are connected in parallel are driven, light of a higher intensity is emitted than in a case where the VCSELs are individually driven. The number of VCSELs included in each light source 20 is, for example, 100 to 1000. The number of VCSELs described above is an example. A side of each light source 20 on which an epitaxial layer functioning as a light emission layer (an active region 206, which will be described later) is provided is referred to as a front surface, a front side, or a front surface side of the light source 20.

On a portion of the front surface of the heat releasing base member 100 corresponding to the light source 20-1, the cathode wire 111F connected to the cathode of the light source 20, the anode wire 112F connected to the anode of the light source 20, and the reference potential wires 113FA and 113FB connected to a reference potential are provided.

The cathode wire 111F is set larger than the planar shape of the light source 20-1 so that the light source 20-1 can be provided on a front surface of the cathode wire 111F. The light source 20-1 is provided on the front surface of the cathode wire 111F with use of an electrically-conductive member such as solder, and the cathode (the cathode electrode 214 in FIG. 5) of the light source 20-1 and the cathode wire 111F are connected to each other.

The anode wire 112F is provided so as to surround three side surfaces (the side surfaces 21A, 21B, and 22A) of the light source 20-1. The anode wire 112F is connected to the anode (the anode electrode 218 in FIG. 5, which will be described later) through bonding wires 23A and 23B on sides where two side surfaces (the side surfaces 21A and 21B) of the light source 20-1 are located.

The reference potential wires 113FA and 113FB are provided outside the anode wire 112F on the sides where the side surfaces 21A and 21B of the light source 20-1 are located. The capacitors 71A and 72A are provided between the reference potential wire 113FA and the anode wire 112F on the side where the side surface 21A of the light source 20-1 is located. The capacitors 71B and 72B are provided between the reference potential wire 113FB and the anode wire 112F on the side where the side surface 21B of the light source 20-1 is located.

The capacitors 71 (the capacitors 71A and 71B) are capacitors (hereinafter referred to as low-ESL capacitors) having reduced equivalent series inductance (ESL), and the capacitors 72 (the capacitors 72A and 72B) are capacitors (hereinafter referred to as non-low-ESL capacitors) having larger equivalent series inductance than the capacitors 71. To shorten a rise time of light emission of each light source 20, it is required that impedance at a high frequency be small in a driving circuit that supplies an electric current for light emission to the light source 20. For this purpose, it is desirable to use a capacitor (i.e., a low-ESL capacitor) configured to reduce equivalent series inductance. However, a low-ESL capacitor often has a small capacity although a planar shape thereof is large (a mount area on the heat releasing base member 100 is large). Meanwhile, a non-low-ESL capacitor uses a ceramic sheet of a high dielectric constant and often has a large capacity although a planar shape thereof is small (a mount area on the heat releasing base member 100 is small). In view of this, the capacitors 71, which are low-ESL capacitors, and the capacitors 72, which are non-low-ESL capacitors, are used in combination. That is, an electric current at a time of rising of light emission of the light source 20 is supplied by the capacitors 71, which are low-ESL capacitors having a small capacity, and an electric current for securing a light amount after rising of light emission is supplied by the capacitors 72, which are non-low-ESL capacitors having a large capacity. This shortens a rise time of the light source 20 and secures a light amount. The low-ESL capacitor is sometimes called a LW-reverse-type capacitor.

The capacitors 71A and 71B, which are low-ESL capacitors, are provided on a central line (the lines with alternate long and short dashes) in the x direction of the light source 20-1. Meanwhile, the capacitors 72A and 72B, which are non-low-ESL capacitors, are provided at positions deviated toward a −x direction side from the central line. With this configuration, a distance from the anode electrode (the anode electrode 218 illustrated in FIG. 5) of the light source 20-1 to the capacitors 71A and 71B, which are low-ESL capacitors becomes shorter than a distance from the light source 20-1 to the capacitors 72A and 72B, which are non-low-ESL capacitors. Accordingly, inductance of an electric current path (sometimes referred to as a driving circuit) along which an electric current for light emission is supplied from the capacitors 71A and 71B, which are low-ESL capacitors, to the light source 20-1 becomes smaller than that of an electric current path along which an electric current for light emission is supplied from the capacitors 72A and 72B, which are non-low-ESL capacitors, to the light source 20-1. This further shortens a rise time of light emission of the light source 20-1.

Although the above description has discussed the light source 20-1, the connection relationship between the light source 20 and the capacitors 71 and 72 also applies to the other light sources 20-2 through 20-4. Although two capacitors 71 (the capacitors 71A and 71B), which are low-ESL capacitors, and two capacitors 72 (the capacitors 72A and 72B), which are non-low-ESL capacitors, are used for a single light source 20 (the light source 20-1) in the above description, the number of capacitors 71 or the number of capacitors 72 may be 1 or may be 3 or more.

As illustrated in FIG. 3, the cathode wires 111F and the anode wires 112F that are connected to the light sources 20-1 through 20-4 are continuous with one another on the front surface of the heat releasing base member 100.

Structure of VCSEL

Figure 5:
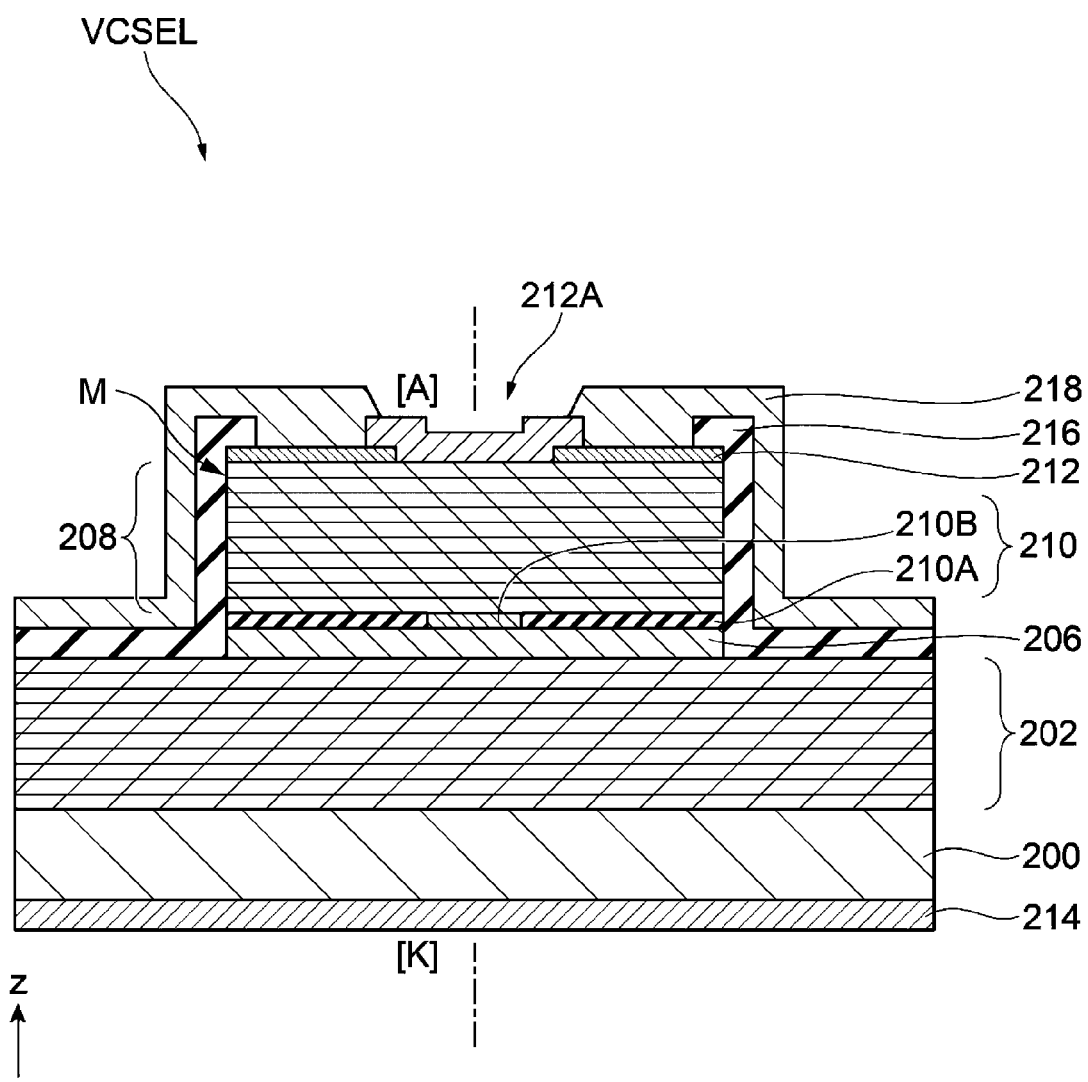
FIG. 5 is a view for explaining a cross-sectional structure of a single VCSEL of a light source.

FIG. 5 is a view for explaining a cross-sectional structure of a single VCSEL in the light source 20. The VCSEL is a VCSEL having a λ resonator structure. The upward direction of the paper on which FIG. 5 is drawn is the z direction.

The VCSEL is configured such that an n-type lower distributed bragg reflector (DBR) 202 in which AlGaAs layers having different Al compositions are alternately stacked, an active region 206 including a quantum well layer sandwiched between an upper spacer layer and a lower spacer layer, and a p-type upper distributed bragg reflector 208 in which AlGaAs layers having different Al compositions are alternately stacked are stacked in order on the semiconductor substrate 200 such as n-type GaAs.

Hereinafter, a distributed bragg reflector is referred to as a DBR.

The n-type lower DBR 202 is a multilayer body including pairs of an $Al_{0.9}Ga_{0.1}As$ layer and an GaAs layer, each of the layers has a thickness of $\lambda/4n_r$ ($\lambda$ is an oscillation wavelength, and $n_r$ is a refractive index of a medium), and 40 pairs of these layers are stacked so that these layers are alternately provided. The n-type lower DBR 202 is doped with silicon, which is an n-type impurity, as a carrier. A carrier concentration, is, for example, $3\times10^{18}$ cm$^{-3}$.

The active region 206 is configured such that the lower spacer layer, the quantum well active layer, and the upper spacer layer are stacked. For example, the lower spacer layer is an undoped $Al_{0.6}Ga_{0.4}As$ layer, the quantum well active layer is an undoped InGaAs quantum well layer and an undoped GaAs barrier layer, and the upper spacer layer is an undoped $Al_{0.6}Ga_{0.4}As$ layer.

The p-type upper DBR 208 is a multilayer body including pairs of a p-type $Al_{0.9}Ga_{0.1}As$ layer and a GaAs layer. Each of the layers of the p-type upper DBR 208 has a thickness of $\lambda/4n_r$, and 29 pairs of these layers are stacked so that these layers are alternately provided. The p-type upper DBR 208 is doped with carbon, which is a p-type impurity, as a carrier. A carrier concentration is, for example, $3\times10^{18}$ cm$^{-3}$. Desirably, a contact layer made of p-type GaAs is formed in a topmost layer of the upper DBR 208, and a p-type AlAs current confinement layer 210 is formed in a lowermost layer of the upper DBR 208 or in an inner part of the upper DBR 208.

By etching a semiconductor layer stacked from the upper DBR 208 to the lower DBR 202, a cylindrical mesa M is formed on the semiconductor substrate 200. This causes the current confinement layer 210 to be exposed on a side surface of the mesa M. An oxidized region 210A oxidized from the side surface of the mesa M and an electrically-conductive region 210B surrounded by the oxidized region 210A are formed in the current confinement layer 210 by an oxidation process. In the oxidation process, an oxidation speed of the AlAs layer is higher than an oxidation speed of the AlGaAs layer, and the oxidized region 210A is oxidized from the side surface of the mesa M toward an inside of the mesa M at an almost constant speed, and therefore a cross-sectional shape of the electrically-conductive region 210B becomes a shape reflecting an external shape of the mesa M, i.e., a circular shape, and a center of the shape almost matches an axis (indicated by the line with alternate long and short dashes) of the mesa M. In the present exemplary embodiment, the mesa M has a columnar structure.

An annular p-side electrode 212 made of a metal in which Ti/Au and the like are stacked is formed in a topmost layer of the mesa M. The p-side electrode 212 makes ohmic-contact with the contact layer provided in the upper DBR 208. An inner side of the annular p-side electrode 212 serves as a light outlet 212A through which laser light is emitted to an outside. That is, the VCSEL emits light in a direction perpendicular to a front surface (a surface on the +z direction side) of the semiconductor substrate 200. The axis of the mesa M is an optical axis. Furthermore, the cathode electrode 214 is formed as an n-side electrode on the rear surface of the semiconductor substrate 200. Note that a front surface (a surface on the +z direction side) of the upper DBR 208 on an inner side of the p-side electrode 212 is a light emission surface. That is, an optical axis direction of the VCSEL is a light emission direction.

An insulating layer 216 is provided so as to cover the front surface of the mesa M excluding a part of the p-side electrode 212 to which the anode electrode 218 is connected and the light outlet 212A. The anode electrode 218 is provided so as to make ohmic-contact with the p-side electrode 212 excluding the light outlet 212A. The anode electrode 218 is provided common to the plural VCSELs. That is, the p-side electrodes 212 of the plural VCSELs that constitute each light source 20 are connected in parallel by the anode electrode 218. In FIG. 5, the anode electrode 218 is indicated by [A] indicative of an anode, and the cathode electrode 214 is indicated by [K] indicative of a cathode.

The VCSEL may oscillate in a single transverse mode or may oscillate in a multiple transverse mode. Light output of a single VCSEL is, for example, 4 mW to 8 mW. Accordingly, in a case where each light source 20 is constituted by 500 VCSELs, light output of the light source 20 is 2 W to 4 W. Furthermore, in a case where four light sources 20 are provided, light output of the light-emitting device 4 is 8 W to 16 W. Heat generated by such large-output light sources 20 is large. Therefore, it is required that heat be released efficiently and sufficiently from the light sources 20.

Figure 6:
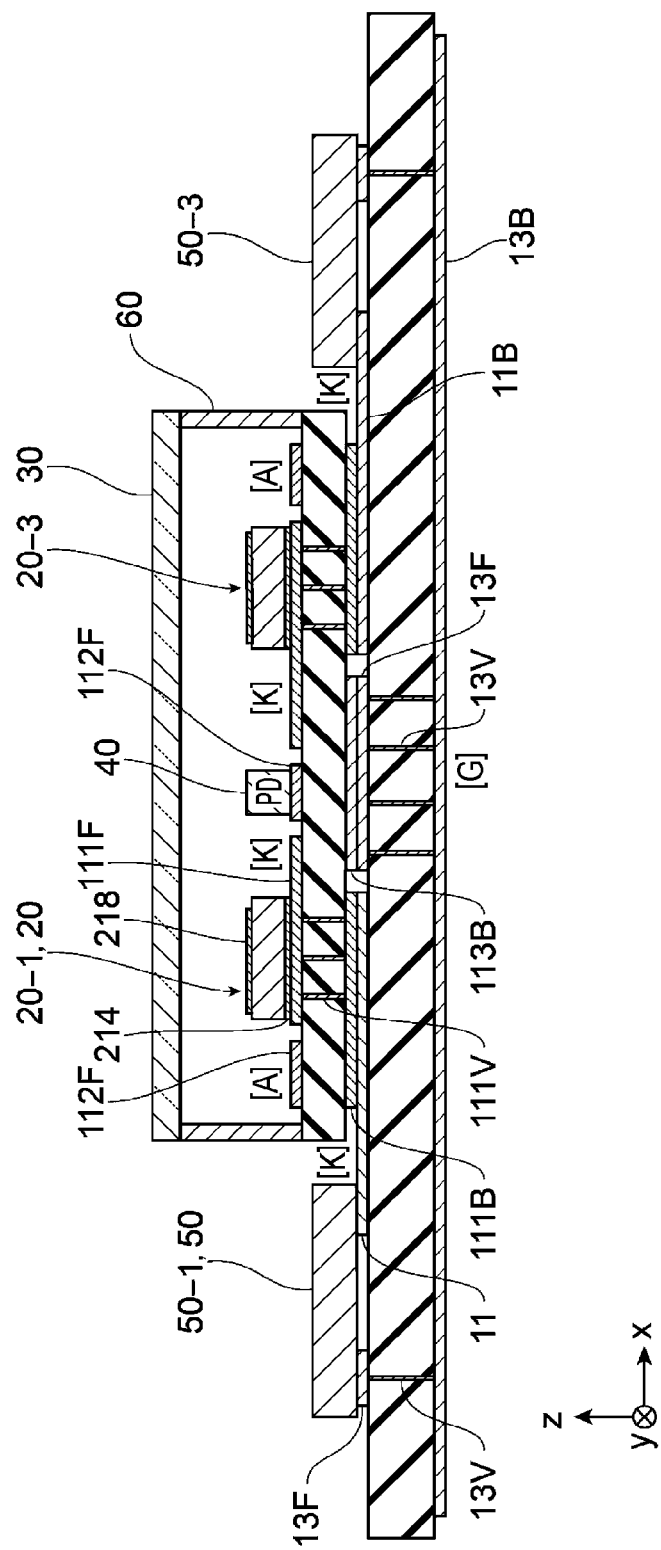
FIG. 6 illustrates an example of a cross-sectional structure of the light-emitting device.

FIG. 6 illustrates an example of a cross-sectional structure of the light-emitting device 4. The cross-sectional view of FIG. 6 is a cross-sectional view taken along line VI-VI in FIG. 3. That is, in FIG. 6, the driving units 50-1, the light source 20-1, the PD 40, the light source 20-3, and the driving units 50-3 are illustrated from the left.

As described above, the light-emitting device 4 is configured such that the driving units 50 (the driving units 50-1 and 50-3 in FIG. 6) and the heat releasing base member 100 are provided on the front surface of the circuit board 10. Furthermore, the light sources 20 (the light sources 20-1 and 20-3 in FIG. 6), the PD 40, and the holding unit 60 are provided on the front surface of the heat releasing base member 100. In FIG. 6, the light diffusion member 30 is held on the holding unit 60 so as to cover the light sources 20-1 and 20-3 and the PD 40.

The circuit board 10 is configured such that a wiring layer in which a wire made of a metal such as a copper (Cu) foil is provided is provided on an insulating base member made of a material such as a glass epoxy resin. In the following description, it is assumed that the circuit board 10 is a two-layer printed wiring board having a wiring layer on a front surface side and a rear surface side of the base member. Meanwhile, the heat releasing base member 100 is an insulating base member having higher thermal conductivity than the circuit board 10.

A cathode wire 11, a reference potential wire 13F, and an anode wire are provided on the front surface side of the circuit board 10. In FIG. 6, illustration of the anode wire is omitted. A reference potential wire 13B is provided on the rear surface side of the circuit board 10. The reference potential wire 13F and the reference potential wire 13B are connected through a through conductor 13V. A through conductor is a conductor obtained by filling a hole formed through the electrically-insulating base member of the circuit board 10 with a material such as copper (Cu). The through conductor is a member that electrically connects a wire provided on a front surface side of the base member of the circuit board 10 and a wire provided on a rear surface side of the circuit board 10. Note that the through conductor is also called a via.

As described above, the cathode wire 111F, the anode wire 112F, and the reference potential wire 113F are provided on the front surface side of the heat releasing base member 100. A cathode wire 111B and a reference potential wire 113B are provided on the rear surface side of the heat releasing base member 100. The cathode wire 111F and the cathode wire 111B are electrically connected to each other through a through conductor 111V provided through the heat releasing base member 100. The reference potential wire 113F and the reference potential wire 113B are electrically connected to each other through a through conductor (not illustrated) provided through the heat releasing base member 100.

The cathode wire 11 provided on the front surface of the circuit board 10 is configured such that one end thereof is connected to the driving units 50 with use of an electrically-conductive member such as solder and the other end thereof is connected to the cathode wire 111B provided on the rear surface side of the heat releasing base member 100 with use of an electrically-conductive member such as solder. That is, the cathode wire 11 is provided so as to extend from the driving units 50 toward the cathode electrode 214 sides of the light sources 20. The cathode wire 111B is connected to the cathode wire 111F through the through conductor 111V provided in the heat releasing base member 100. The cathode wire 111F is connected to the cathode electrodes 214 of the light sources 20.

The anode wire 112F provided on the front surface side of the heat releasing base member 100 is connected to the anode wire provided on the rear surface side of the heat releasing base member 100 through a through conductor (not illustrated in FIG. 6). The anode wire provided on the rear surface side of the heat releasing base member 100 is connected to the anode wire provided on the front surface of the circuit board 10. The anode wire provided on the front surface of the circuit board 10 is connected to a + side of a power source 82 (see FIG. 8, which will be described later).

Meanwhile, the reference potential wire 113B provided on the rear surface side of the heat releasing base member 100 is connected to the reference potential wire 13F provided on the front surface side of the circuit board 10. The reference potential wire 13F is connected to the reference potential wire 13B provided on the rear surface side through the through conductor 13V. The reference potential wire 13B is connected to a − side of the power source 82 (see FIG. 8, which will be described later).

Furthermore, a cathode side of the PD 40 is connected to the anode wire 112F on the front surface of the heat releasing base member 100.

The heat releasing base member 100 and the light diffusion member 30 are described below.

Heat Releasing Base Member 100

One example of a base member made of a glass epoxy resin used for the circuit board 10 is a base member called FR-4. This base member has a thickness of approximately 100 μm and has thermal conductivity of approximately 0.4 W/m·K. Note that thermal conductivity of copper (Cu) is approximately 360 W/m·K. The thermal conductivity is a value at 25° C. unless otherwise specified.

The heat releasing base member 100 is constituted by an insulating base member that has higher thermal conductivity than the circuit board 10. For example, the thermal conductivity of the heat releasing base member 100 is preferably 10 W/m·K or more, more preferably 50 W/m·K or more, still more preferably 100 W/m·K or more. A material having thermal conductivity of 10 W/m·K or more is, for example, alumina ($Al_2O_3$) having thermal conductivity of 20 W/m·K to 30 W/m·K. A material having thermal conductivity of 50 W/m·K or more is, for example, silicon nitride ($Si_3N_4$) having thermal conductivity of approximately 85 W/m·K. A material having thermal conductivity of 100 W/m·K or more is, for example, aluminum nitride (AlN) having thermal conductivity of 150 W/m·K to 250 W/m·K. These materials are sometimes referred to as ceramic materials. That is, the whole heat releasing base member 100 is desirably made of a ceramic material. The heat releasing base member 100 may be made of an insulating material of other kinds having high thermal conductivity such as silicon (Si) doped with no impurity. It is assumed here that the heat releasing base member 100 is aluminum nitride (AlN).

In a case where the light sources 20 are provided on the front surface of the heat releasing base member 100, heat generated by the light sources 20 is released while passing the cathode electrode 214, the cathode wire 111F provided on the front surface side of the heat releasing base member 100, the heat releasing base member 100, the reference potential wire 113B provided on the rear surface side of the heat releasing base member 100, and the reference potential wire 13F, the through conductor 13V, and the reference potential wire 13B of the circuit board 10. That is, since the reference potential wire 113B is provided on the rear surface side of the heat releasing base member 100, heat generated by the light sources 20 transfers to the reference potential wire 13B provided on the rear surface side of the circuit board 10. In general, the reference potential wire 13B is provided on the entire rear surface of the circuit board 10. Accordingly, the heat is released to an outside from the reference potential wire 13B provided on the rear surface side of the circuit board 10. That is, it becomes easy to release heat from the light sources 20. In a case where the reference potential wire 113B is not provided on the rear surface side of the heat releasing base member 100, heat generated by the light sources 20 is hard to transfer to the reference potential wire 13B provided on the rear surface side of the circuit board 10. Accordingly, heat generated by the light sources 20 is hard to be released even if the heat releasing base member 100 is used.

Light Diffusion Member 30

Figure 7A:
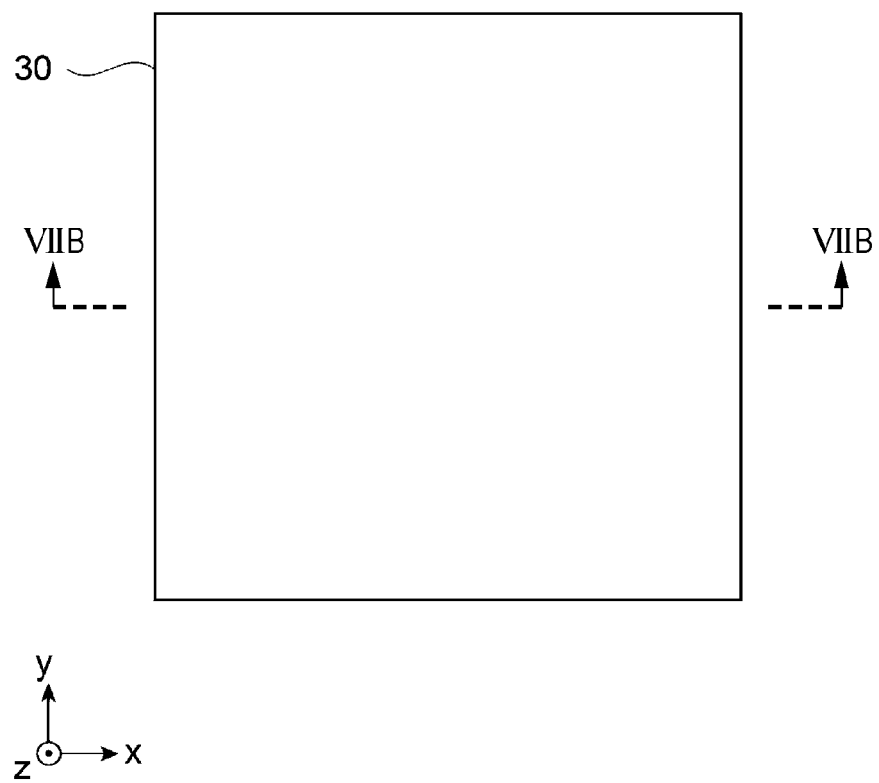
FIGS. 7A and 7B are views for explaining an example of a light diffusion member.
Figure 7B:
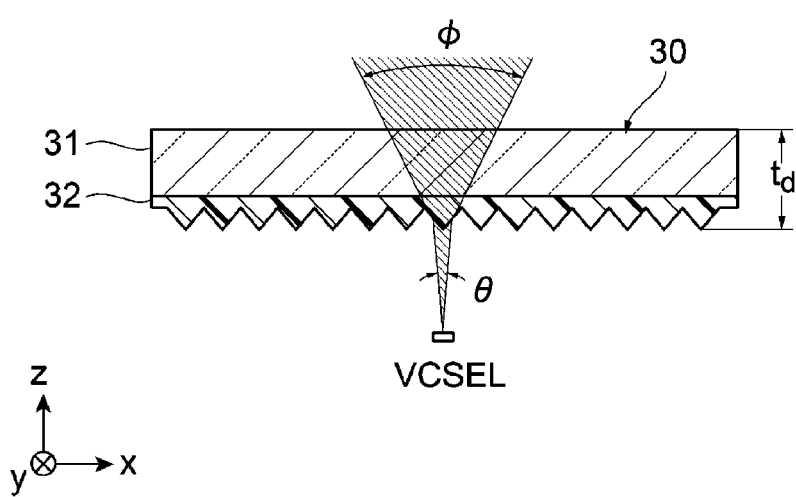

FIGS. 7A and 7B are views for explaining an example of the light diffusion member 30. FIG. 7A is a plan view, and FIG. 7B is a cross-sectional view taken along line VIIB-VIIB of FIG. 7A. In FIG. 7A, it is assumed that the rightward direction and the upward direction of the paper on which FIG. 7A is drawn are the x direction and the y direction, respectively. It is assumed that the frontward direction of the paper on which FIG. 7A is drawn is the z direction. A surface of the light diffusion member 30 on the +z direction side is referred to as a front surface or a front surface side, and a surface of the light diffusion member 30 on the −z direction side is referred to as a rear surface or a rear surface side. Accordingly, in FIG. 7B, the rightward direction, the depth direction, and the upward direction of the paper on which FIG. 7B is drawn are the x direction, the y direction, and the z direction, respectively.

As illustrated in FIG. 7B, the light diffusion member 30 includes, for example, a glass substrate 31 whose both surfaces are parallel and flat and a resin layer 32 having irregularities for diffusing light on a rear surface (−z direction) side of the glass substrate 31. The light diffusion member 30 widens a divergence angle of light incident from the VCSELs of the light sources 20. That is, the irregularities of the resin layer 32 of the light diffusion member 30 refract and scatter light so that incident light is output as light having a wider divergence angle. That is, as illustrated in FIG. 7B, the light diffusion member 30 causes light having a divergence angle $\theta$ emitted from the VCSELs and incident from the rear surface side to be output as light having a divergence angle $\varphi$, which is larger than $\theta$, from the front surface side ($\theta < \varphi$). This means that use of the light diffusion member 30 widens an irradiation region irradiated with light emitted from the light sources 20 as compared with a case where the light diffusion member 30 is not used. The divergence angles $\theta$ and o are full width at half maximum (FWHM).

It is assumed here that a planar shape of the light diffusion member 30 is identical to a planar shape of the heat releasing base member 100. A thickness (a thickness in the z direction) ta of the light diffusion member 30 is 0.1 mm to 1 mm. Note that the planar shape of the light diffusion member 30 need not be identical to the planar shape of the heat releasing base member 100 and may be any of other planar shapes such as a polygonal shape and a circular shape.

As illustrated in FIGS. 3 and 6, the light diffusion member 30 is provided so as to cover the light sources 20, the PD 40, and the capacitors 71 and 72. Covering the light sources 20 with the light diffusion member 30 means that the light diffusion member 30 is provided on emission paths of light emitted by the light sources 20 so that the light emitted by the light sources 20 passes through the light diffusion member 30. That is, this state is a state in which the light sources 20 and the light diffusion member 30 overlap each other in a case where the light sources 20 are seen through the light diffusion member 30 from the front surface side of the light diffusion member 30, that is, in top view.

The PD 40 is covered with the light diffusion member 30, and therefore the PD 40 receives light emitted from the light sources 20 and then reflected by the rear surface (surface in the −z direction) of the light diffusion member 30. Accordingly, the measurement controller 8 controls the light sources 20 to emit a predetermined amount of light on the basis of an electric signal corresponding to an amount of light received by the PD 40.

The light diffusion member 30 may be provided so as to cover the light sources 20 and the PD 40. That is, the capacitors 71 and 72 need not be covered. In this case, a part that covers the capacitors 71 and 72 may be a lid constituted by a member similar to the holding unit 60. In a case where the light diffusion member 30 covers the light sources 20 and the PD 40 and does not cover the capacitors 71 and 72, an area of the light diffusion member 30, which is expensive, becomes small. This reduces a cost of the light-emitting device 4.

The holding unit 60 is, for example, a member that is molded from a resin material. The holding unit 60 is desirably colored, for example, in black to absorb light emitted from the light sources 20. As a result, light emitted toward the holding unit 60 by the light sources 20 is absorbed. This keeps the object to be measured from being irradiated with light that has passed through the holding unit 60 and light reflected by the holding unit 60.

Next, a driving circuit for driving the light sources 20 is described.

Driving Circuit for Driving Light Sources 20

In a case where the light sources 20 are driven at a higher speed, the light sources 20 are desirably driven by low-side driving. The low-side driving refers to a configuration in which a driving element such as an MOS transistor is located on a downstream side of a current path relative to a target to be driven such as a VCSEL. Conversely, a configuration in which a driving element is located on an upstream side is referred to as high-side driving.

Figure 8:
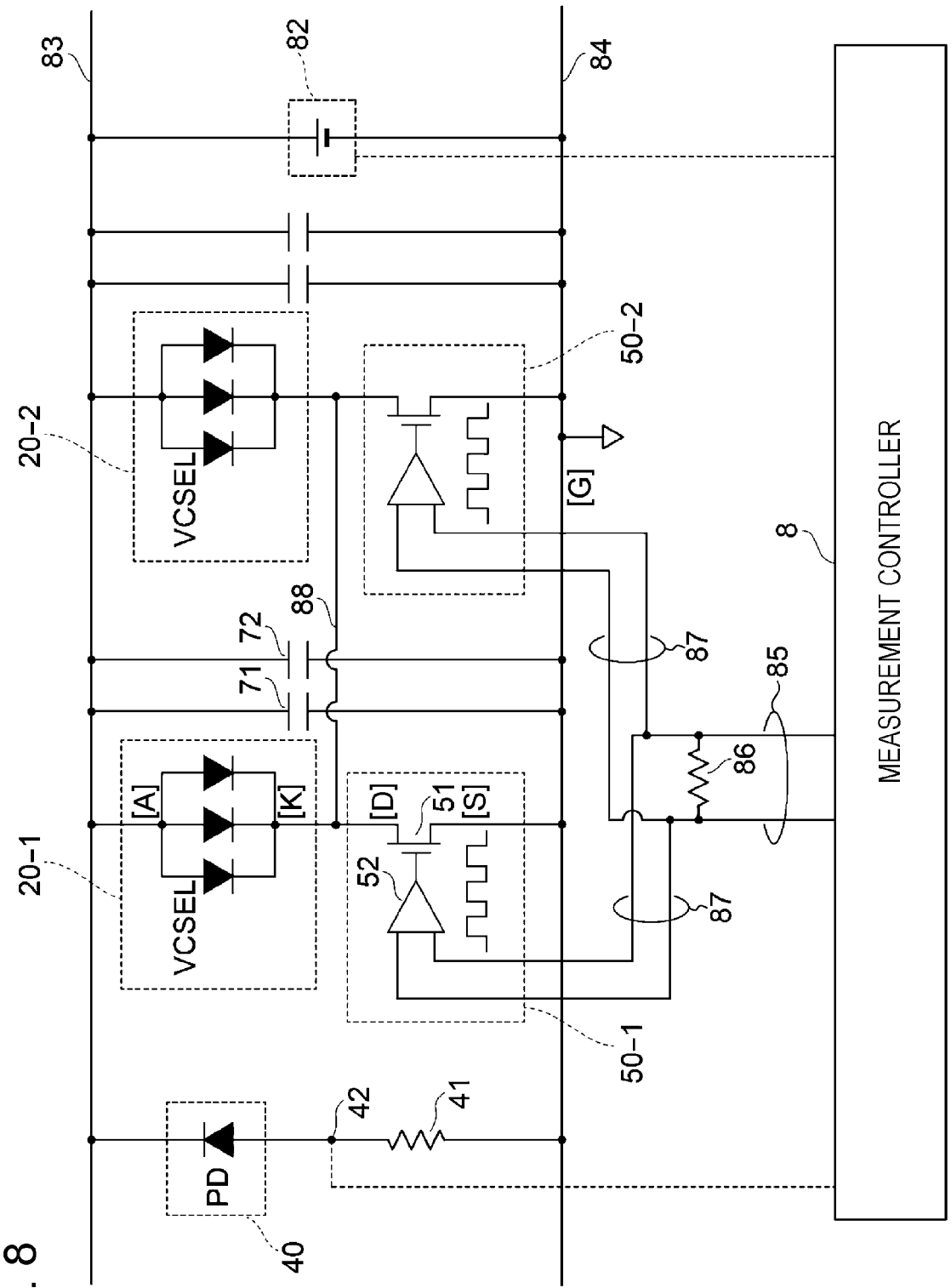
FIG. 8 illustrates an example of an equivalent circuit in a case where the light sources are driven by low-side driving.

FIG. 8 illustrates an example of an equivalent circuit for driving the light sources 20 by low-side driving. FIG. 8 illustrates an example in which two light sources (the light sources 20-1 and 20-2) are driven. FIG. 8 illustrates the two light sources (the light sources 20-1 and 20-2), the capacitors 71 and 72 provided for each of the two light sources 20, two driving units 50-1 and 50-2 that drive the two light sources 20, the PD 40, and the power source 82. Note that the power source 82 is provided in the measurement controller 8. The power source 82 generates a direct-current voltage whose + side is a power source potential and whose − side is a reference potential. The power source potential is supplied to a power source line 83, and the reference potential is supplied to a reference line 84.

The following describes a circuit for driving the light sources 20 by taking, as an example, the light source 20-1 and the driving unit 50-1, which are referred to as the light source 20 and the driving unit 50, respectively in the following description.

The light source 20 is constituted by plural VCSELS that are connected in parallel as described above. The anode electrode 218 (indicated by [A] in FIG. 8) of the VCSELs is connected to the power source line 83.

The driving unit 50 includes an n-channel MOS transistor 51 and a buffer circuit 52 that supplies a driving signal to a gate of the MOS transistor 51. A drain (indicated by [D]) of the MOS transistor 51 is connected to the cathode electrode 214 (indicated by [K] in FIG. 8) of the VCSELs. A source (indicated by [S]) of the MOS transistor 51 is connected to the reference line 84. The gate of the MOS transistor 51 is connected to an output terminal of the buffer circuit 52. That is, the VCSELs and the MOS transistor 51 of the driving unit 50 are connected in series between the power source line 83 and the reference line 84. Based on a driving signal supplied from the measurement controller 8, the buffer circuit 52 outputs an "H level" that turns the MOS transistor 51 on or an "L level" that turns the MOS transistor 51 off.

The cathodes ([K]) of the plural light sources 20 are connected to one another. Specifically, in FIG. 8, the cathode of the light source 20-1 and the cathode of the light source 20-2 are connected by a connection line 88. The connection line 88 is, specifically, the cathode wire 111F provided on the front surface side of the heat releasing base member 100, and the cathodes of the four light sources 20 are connected to one another by the connection line 88, as illustrated in FIG. 3. That is, the cathode wire 111F is an example of a connection wire.

One terminal of the capacitor 71 and one terminal of the capacitor 72 are connected to the power source line 83, and the other terminal of the capacitor 71 and the other terminal of the capacitor 72 are connected to the reference line 84. The capacitors 71 and 72 are connected in parallel.

A cathode of the PD 40 is connected to the power source line 83, and an anode of the PD 40 is connected to one terminal of a detection resistive element 41. The other terminal of the detection resistive element 41 is connected to the reference line 84. That is, the PD 40 and the detection resistive element 41 are connected in series between the power source line 83 and the reference line 84. An output terminal 42, which is a connection point between the PD 40 and the detection resistive element 41, is connected to the measurement controller 8. The output terminal 42 transmits an electric signal corresponding to an amount of light received by the PD 40 to the measurement controller 8.

The buffer circuits 52 of the plural driving units 50 are connected to the measurement controller 8 by a driving signal line 85. The measurement controller 8 transmits a driving signal to the driving signal line 85. For example, the measurement controller 8 supplies a differential signal such as a low voltage differential signal (LVDS) or a current mode logic (CML) to the driving signal line 85. Use of a differential signal enables high-speed transfer of a driving signal by suppressing influence of noise. In this example, the driving signal line 85 is terminated by a single terminating resistor 86 and branches to plural driving signal lines 87 at this part. The plural driving signal lines 87 are connected to the buffer circuits 52 of the respective plural driving units 50. That is, a common driving signal is supplied to the buffer circuits 52 of the plural driving units 50.

Next, a method for driving the light sources 20 that is low-side driving is described.

First, it is assumed that output of the buffer circuits 52 of the driving units 50 is set to an "L level" by a driving signal supplied from the measurement controller 8. In this case, the MOS transistor 51 is in an off state. That is, no electric current flows between the source ([S]) and the drain ([D]) of the MOS transistor 51. Accordingly, no electric current flows through the VCSELs that are connected in series with the MOS transistor 51. That is, the VCSELs do not emit light.

One terminal of the capacitor 71 and one terminal of the capacitor 72 are connected to the power source line 83 and become a power source potential, and the other terminal of the capacitor 71 and the other terminal of the capacitor 72 are connected to the reference line 84 and become a reference potential. Accordingly, the capacitors 71 and 72 are charged with an electric current flowing from (an electric charge supplied from) the power source 82.

Next, when the output of the buffer circuits 52 of the driving units 50 shifts from an "L level" to an "H level", the MOS transistor 51 shifts from an off state to an on state. As a result, the capacitors 71 and 72, and the MOS transistor 51 and the VCSELs that are connected in series constitute a closed loop. This causes the electric charge accumulated in the capacitors 71 and 72 to be supplied to the MOS transistor 51 and the VCSELs that are connected in series. That is, a driving electric current flows through the VCSELs, and the VCSELs emit light. This closed loop is a driving circuit that drives the light sources 20.

Then, when the output of the buffer circuits 52 of the driving units 50 shift from an "H level" to an "L level" again, the MOS transistor 51 shifts from an on state to an off state. This opens the closed loop (driving circuit) of the capacitors 70A and 70B, and the MOS transistor 51 and the VCSELs that are connected in series. As a result, no driving electric current flows through the VCSELS. Accordingly, the VCSELs stop light emission. The capacitors 70A and 70B are charged with an electric charge supplied from the power source 82.

As described above, when the output of the buffer circuits 52 repeatedly switches between the "H level" and the "L level", the MOS transistor 51 repeatedly turns on and off, and the VCSELs repeatedly switch between light emission and non-light-emission. The repeated on and off of the MOS transistor 51 is sometimes referred to as switching.

As described above, by discharging the electric charges accumulated in the capacitors 71 and 72 at once and supplying, as a driving electric current, the electric charges to the VCSELs when the MOS transistor 51 shifts from an off state to an on state, the VCSELs are caused to emit light in a short rise time. The capacitors 71 are low-ESL capacitors having a small capacity, and the capacitors 72 are non-low-ESL capacitors having a large capacity, as described above. Accordingly, when the MOS transistor 51 shifts from an off state to an on state, an electric charge is first supplied from the capacitors 71, which are low-ESL capacitors having small inductance, and thereby an electric current for rising of light emission of the light source 20 is supplied. Then, an electric charge is supplied from the capacitors 72, which are non-low-ESL capacitors having large inductance but has a large capacity, to secure light amounts of the light sources. In this way, a rise time of light emission of the light sources 20 is shortened.

In a case where the light-emitting device 4 includes plural light sources 20 as illustrated in FIG. 3, a common control signal is transmitted from the measurement controller 8 to the plural driving units 50. This synchronizes signals ("H level") output from the buffer circuits 52 of the driving units 50. However, there are inevitably differences in property among the plural light sources 20 and the plural driving units 50. Accordingly, the plural light sources 20 may undesirably include a light source 20 that is delayed in light emission. Since a rise time of light emission of the light-emitting device 4 is a sum of light emission of the light sources 20, the delay in light emission prolongs the rise time of light emission.

In view of this, in the light-emitting device 4 according to the first exemplary embodiment, the cathodes of the plural light sources 20 are connected to one another by the connection line 88 (see FIG. 8) so that differences in potential are unlikely to occur among the cathodes of the light sources 20. In this way, a rise time of light emission of the light-emitting device 4 is shortened.

It is possible to drive the plural light sources 20 connected in parallel by using a single driving unit 50. However, output of the four light sources 20 is approximately 10 W, as described above. A rise time is 1 ns to 2 ns in the case of such a high-output driving unit. In view of this, the driving unit 50 is provided for each of the light sources 20, and the light sources 20 are driven in parallel. To shorten a rise time, a common control signal is supplied as a differential signal to the plural driving units 50, and the cathodes of the plural light sources 20 driven by the plural driving units 50 are connected to one another.

Figure 9:
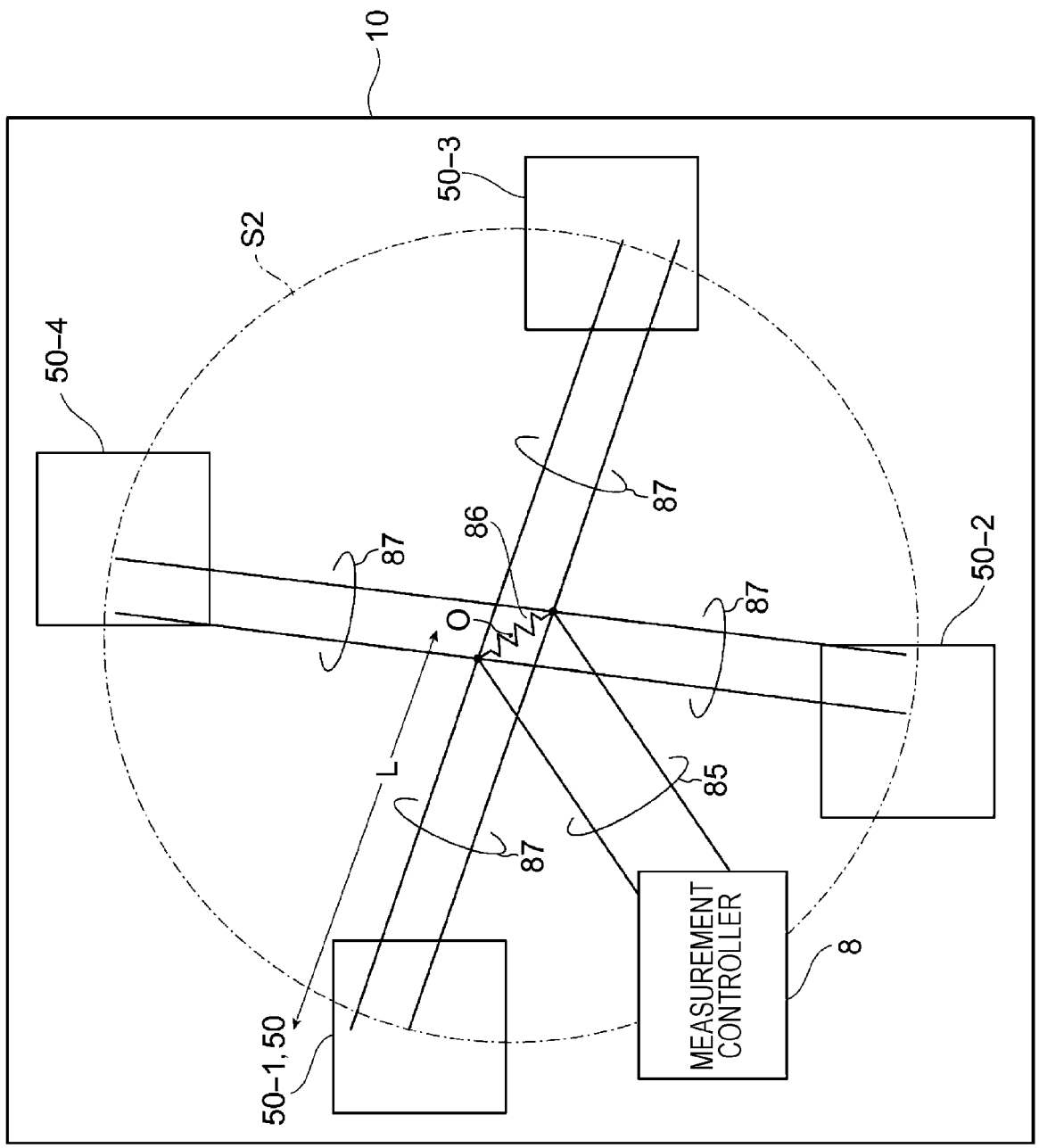
FIG. 9 is a view for explaining a method for connecting a driving signal line for transferring a driving signal and driving units.

FIG. 9 is a view for explaining a method for connecting the driving signal line 85 for transferring a driving signal and the driving units 50. FIG. 9 illustrates the four driving units 50 in FIG. 3.

As described above, the four driving units 50 are disposed on the circle S1 whose center is the center 0 of the light-emitting device 4. The terminating resistor 86 is provided on the rear surface side of the circuit board 10 so as to be located at a part (central part) corresponding to the center 0 of the light-emitting device 4. The driving signal line 85 is provided between the terminating resistor 86 and the measurement controller 8. Furthermore, four driving signal lines 87 are provided so as to extend from both terminals of the terminating resistor 86 to the four driving units 50 (the driving units 50-1, 50-2, 50-3, and 50-4), respectively. With this configuration, differences in length L are unlikely to occur between the driving signal lines 87 that connect the terminating resistor 86 and the driving units 50, and the lengths of the driving signal lines 87 that connects the terminating resistor 86 and the driving units 50 are shortened. In a case where the lengths of the driving signal lines 87 are short, a downstream side relative to the terminating resistor 86 can be handled as a lumped-constant circuit. Accordingly, even in a case where the terminating resistor 86 is common to the plural driving units 50, signal disturbance is suppressed. For example, in a case where the lengths L of the driving signal lines 87 are approximately $\frac{1}{7}$ of the wavelength λ of the driving signal, for example, 10 mm or less in a case where a pulse signal of a repetition frequency of 200 MHz is transmitted, the terminating resistor 86 may be common to the plural driving units 50. Note that the terminating resistor 86 is, for example, 100Ω.

In general, the terminating resistor 86 is provided for each of the driving units 50. In this case, however, in a case where a common signal is transmitted to the plural driving units 50, a voltage of the signal supplied to the driving units 50 decreases. In view of this, it is desirable that the common terminating resistor 86 be provided while shortening the lengths L of the driving signal lines 87 that connects the plural driving units 50 and the terminating resistor 86.

With the above configuration, a rise time of light emission is 500 ps or less in a case where an electric current for light emission of the light-emitting device 4, which includes the four light sources 20, is 4 A.

Although four light sources 20 and four driving units 50 are used in the light-emitting device 4 in the above description, the number of light sources 20 and the number of driving units 50 may be any even number such as 2 or 6.

Second Exemplary Embodiment

In the light-emitting device 4 to which the first exemplary embodiment is applied, the heat releasing base member 100 is used. The heat releasing base member 100 is not necessarily needed. In a light-emitting device 4' to which the second exemplary embodiment is applied, light sources 20 and other members are provided on a front surface of a circuit board 10.

Except for this, the light-emitting device 4' to which the second exemplary embodiment is applied is similar to the light-emitting device 4 to which the first exemplary embodiment is applied, and description of similar parts are omitted, and differences are described below.

Figure 10:
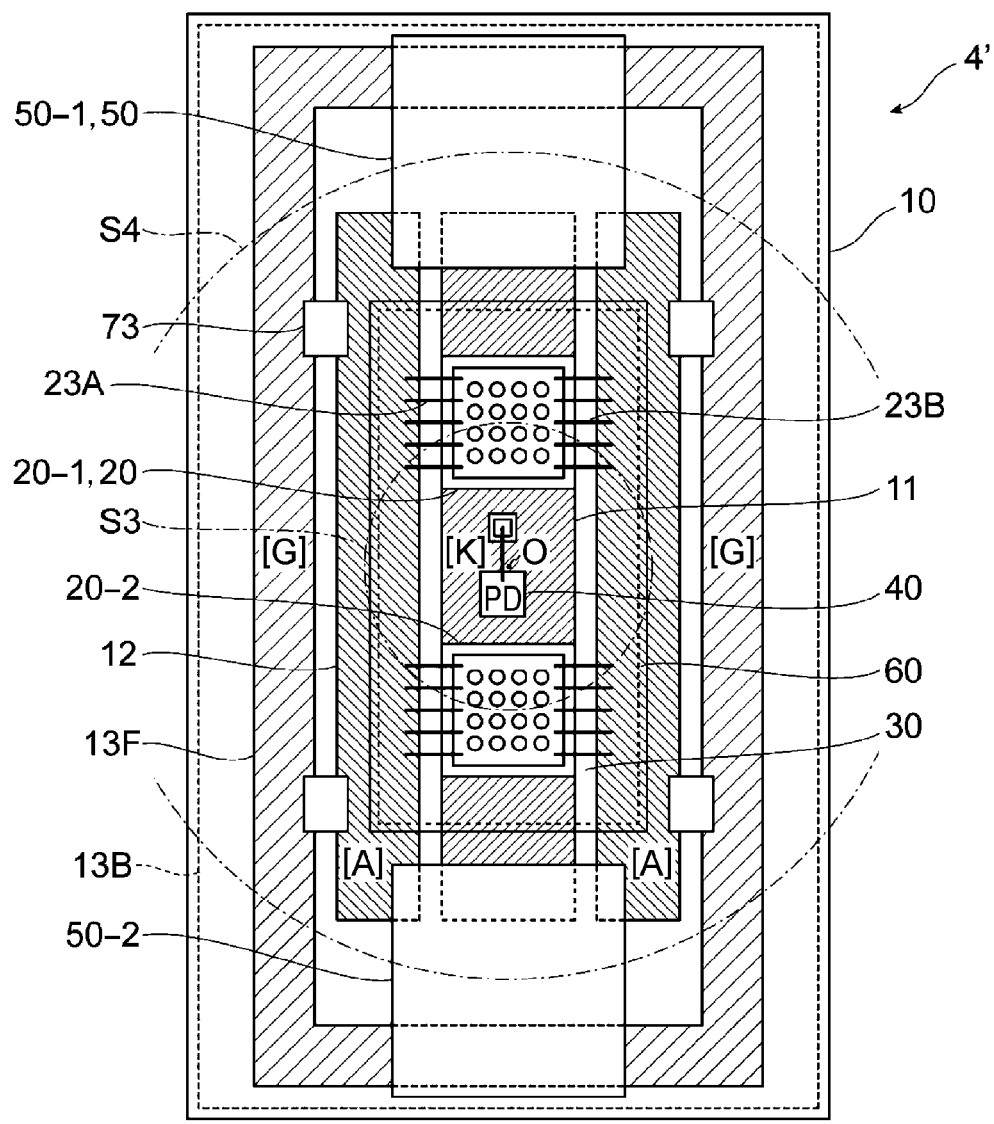
FIG. 10 is a view for explaining an example of a light-emitting device to which the second exemplary embodiment is applied.

FIG. 10 is a view for explaining an example of the light-emitting device 4' to which the second exemplary embodiment is applied. FIG. 10 is a plan view of the light-emitting device 4'. Parts having functions identical to those of the light-emitting device 4 to which the first exemplary embodiment is applied are given identical reference signs.

The light-emitting device 4' includes a circuit board 10, two light sources 20, and four capacitors 73. Furthermore, the light-emitting device 4' includes a holding unit 60 and a light diffusion member 30. The two light sources 20 and the four capacitors 73 are provided on a front surface of the circuit board 10. A cathode wire 11, an anode wire 12, and a reference potential wire 13F are provided on the front surface of the circuit board 10. A reference potential wire 13B is provided on a rear surface of the circuit board 10. The reference potential wire 13F and the reference potential wire 13B are electrically connected to each other through a through conductor (not illustrated).

In the light-emitting device 4', the light sources 20 are disposed on a circle S3 whose center is a center 0, which is a center of the light sources 20. The driving units 50 are disposed on a circle S4 whose center is the center 0. The cathode wire 11 is provided so as to connect a cathode of the light source 20-1 and a cathode of the light source 20-2. That is, in the light-emitting device 4' to which the second exemplary embodiment is applied, the cathode wire 11 is an example of a connection wire.

The capacitors 73 may be low-ESL capacitors or may be non-low-ESL capacitors. Low-ESL capacitors and non-low-ESL capacitors may be used in combination as in the light-emitting device 4 to which the first exemplary embodiment is applied.

Although two light sources 20 and two driving units 50 are used in the light-emitting device 4' to which the second exemplary embodiment is applied illustrated in FIG. 10, the number of light sources 20 and the number of driving units 50 may be an even number such as 4.

In the light-emitting device 4 to which the present exemplary embodiment is applied, the light diffusion member 30 for outputting incident light after changing a spread angle of the incident light to a larger angle by diffusion is used. Alternatively, a diffractive member such as a diffractive optical element (DOE) for outputting incident light after changing a direction of the incident light to a different direction may be used.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A light-emitting device comprising:
   a plurality of driving units;
   a plurality of laser element arrays connected to the respective plurality of driving units;
   a connection wire that interconnects each of first terminals of the plurality of laser element arrays, the first terminals being connected to the plurality of driving units;
   a circuit board on which the driving units are mounted; and
   a plurality of driving signal lines that are connected to the plurality of driving units and supply a driving signal to the plurality of driving units,
   wherein the plurality of driving signal lines extend from a central part of the circuit board to the plurality of driving units.

2. The light-emitting device according to claim 1, wherein
   the plurality of driving units each include a driving element that turns on and off an electric current flowing through a corresponding one of the plurality of laser element arrays, and
   the driving element is connected to the corresponding one of the plurality of laser element arrays so as to be provided on a downstream side of an electric current path relative to the corresponding one of the plurality of laser element arrays and drives the corresponding one of the plurality of laser element arrays by low-side driving.

3. The light-emitting device according to claim 1, wherein
   the circuit board includes a reference potential wire to which a reference potential is supplied and the connection wire, and
   the plurality of driving units are connected to the reference potential wire and the connection wire that are common to the plurality of driving units.

4. The light-emitting device according to claim 2, wherein
   the circuit board includes a reference potential wire to which a reference potential is supplied and the connection wire, and
   the plurality of driving units are connected to the reference potential wire and the connection wire that are common to the plurality of driving units.

5. The light-emitting device according to claim 3, further comprising a heat releasing base member that is provided on the circuit board and has higher thermal conductivity than the circuit board,
   wherein the plurality of laser element arrays are provided on the heat releasing base member.

6. The light-emitting device according to claim 3, wherein the plurality of driving units are driven in parallel by a common driving signal.

7. The light-emitting device according to claim 1, wherein the driving signal is supplied as a differential signal; and a terminating resistor is provided at a part from which the plurality of driving signal lines extend.

8. The light-emitting device according to claim 1, further comprising a diffusion member that diffuses light emitted from the plurality of laser element arrays and outputs the diffused light.

9. The light-emitting device according to claim 1, further comprising a diffractive member that diffracts light emitted from the plurality of laser element arrays and outputs the diffracted light.

10. The light-emitting device according to claim 1, further comprising a light amount monitoring light receiving element that monitors light amounts of the plurality of laser element arrays.

11. An optical device comprising:
    the light-emitting device according to claim 1; and
    a light receiving unit that receives light emitted from the plurality of laser element arrays of the light-emitting device and then reflected by an object to be measured.

12. A measurement device comprising:
    the optical device according to claim 11; and
    a distance specifying unit that specifies a distance to an object to be measured on a basis of a period from emission of light from the plurality of laser element arrays of the optical device to reception of the light by the light receiving unit.

13. An information processing apparatus comprising:
    the measurement device according to claim 12; and
    an authentication processing unit that performs authentication processing concerning use of the information processing apparatus on a basis of a result obtained by the distance specifying unit of the measurement device.

14. The light-emitting device according to claim 1,
    wherein the plurality of laser element arrays comprises a first laser element array and a second laser element array, and
    wherein a first terminal of the first laser element array and a first terminal of the second laser element array are connected by the connection wire.

* * * * *